United States Patent [19]

Weng

[11] Patent Number: 4,989,211
[45] Date of Patent: Jan. 29, 1991

[54] SECTOR MIS-SYNCHRONIZATION DETECTION METHOD

[75] Inventor: Lih-Jyh Weng, Lexington, Mass.

[73] Assignee: Digital Equipment Corporation, Maynard, Mass.

[21] Appl. No.: 193,109

[22] Filed: May 12, 1988

[51] Int. Cl.⁵ .............................. G06F 11/00
[52] U.S. Cl. ........................ 371/42; 371/37.1
[58] Field of Search ............ 371/42, 37, 38, 39, 371/40, 46, 47, 47.1, 37.1, 37.4, 40.1, 40.4, 38.1, 39.1; 360/53, 48, 51; 375/110, 118, 108

[56] References Cited

U.S. PATENT DOCUMENTS

| | | | |
|---|---|---|---|
| 3,571,794 | 3/1971 | Tong | 371/42 |
| 3,668,632 | 6/1972 | Oldham | 371/42 |
| 4,413,339 | 11/1983 | Riggle | 371/38 |
| 4,481,648 | 11/1984 | Fugii | 371/42 X |
| 4,696,008 | 9/1987 | Takei | 360/53 X |
| 4,723,243 | 2/1988 | Joshi | 371/37.1 |
| 4,729,043 | 3/1988 | Worth | 371/38 X |
| 4,856,003 | 8/1989 | Weng | 371/37.1 |

OTHER PUBLICATIONS

D. Mandelbaum, "Synchronization of Codes by Means of Kautz's Fibonacci Encoding", IEEE vol. IT-18, No. 2, 3/1972, pp. 281-283.

Primary Examiner—Jerry Smith
Assistant Examiner—Robert W. Beausoliel
Attorney, Agent, or Firm—Nutter McClennen & Fish

[57] ABSTRACT

A data encoder is set to an initial condition by encoding preliminary symbols. The encoder is then used to encode the data to generate ECC symbols. The data and the generated ECC symbols are then recorded on a disk as code words. Thereafter, when a data code word is read it is again encoded in the initialized encoder to generate new ECC symbols. If the data read from the disk is one or more symbols out of synchronization, errors due to the initial condition will be found. The locations of the errors due to missynchronization will be in symbols corresponding to the initial condition, that is, in the preliminary symbols and beyond the boundary of the code word data, indicating the synchronization error. Alternatively, the locations of errors due to defects in the disk or misinterpretation of the data signal are within the code word data. Thus a missynchronization ofoneof more full symbols can be readily detected.

6 Claims, 4 Drawing Sheets

SECTOR MIS-SYNCHRONIZATION DETECTION METHOD

FIELD OF INVENTION

The invention relates generally to data synchronization and more specifically to synchronizing read/write operations with information read from a magnetic disk.

BACKGROUND OF THE INVENTION

Digital data processing systems typically include data storage devices, for example, multi-disk disk drives. Data is recorded on the disks in concentric tracks. The tracks are divided into sectors, and each sector is further divided into several sections including, for example, a header section and a data section. Data is recorded in (written) or retrieved from (read) the data portions of the sectors while synchronization information and address information, that is, disk surface number, track number and sector number, are stored in the header sections.

Data is read from or written to the disks using read/write heads. Each head is associated with a particular disk surface or portion of a disk surface. As the disks rotate under the heads, data is, for example, read from a particular sector when the associated head is over the data portion of that sector.

To begin a read or write operation the appropriate head is moved to the track containing the selected sector. Unless the head was used in the immediately preceding read or write operation, the head, or more specifically the timer and clocks associated with the read/write operation, must then be synchronized to the disk so that the sector addresses rotating under the head can be read. Once it is synchronized to the header synchronization information, it locates the selected sector by reading the sector addresses. When the sector is located the head locates the start of the data section of the sector and it performs the read or write operation. If, for example, during a read operation the start of the data section is not exactly located, inappropriate information read from the disk may be interpreted as data.

The data read from the disk is typically in encoded form. Prior to recording the data is encoded using error correction codes (ECC's). Encoding the data avoids losing it if it becomes corrupted due to a defect in the disk or noise signals in the read or write channels, either of which may cause the data signal to be misinterpreted. The result of misinterpreting the data signal is erroneous data. The error correction codes ("ECC's") are employed to, as the name implies, correct the erroneous data.

Before a string of data symbols is written to a disk, it is mathematically encoded to form ECC symbols. The ECC symbols are then appended to the data string to form code words-data symbols plus ECC symbols—and the code words are written to or stored on the disks. When data is to be read from the disks, the code words containing the data symbols are retrieved from the disks and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple independent errors. One of the most effective types of ECC used for the correction of multiple errors is a Reed-Solomon code [For a detailed description of Reed-Solomon codes, see Peterson and Weldon, *Error Correction Codes*]. To correct multiple errors in strings of data symbols, Reed-Solomon codes efficiently and effectively utilize the various mathematical properties of sets of symbols known as Galois Fields, represented "$GF(P^q)$", where "P" is a prime number and "q" can be thought of as the number of digits, base P, in each element or symbol in the field. "P" usually has the value 2 in digital computer applications and, therefore, "q" is the number of bits in each symbol.

The size of a Galois Field is $P^q$ symbols, that is, the field has $P^q$ elements. Thus if $GF(2^8)$ is the selected field, there are $2^8$ or 256 elements and each element of the field is an eight-bit symbol. The non-zero elements are of the form $\alpha^i$, where "$\alpha$" is a primitive element of the field and $0 \leq i \leq P^q - 1$. Thus each element is a multiple of $\alpha$. Galois Fields are finite fields, that is, they have a finite number of elements. Thus for each $\alpha^k$, $k > p^q$, there is an $\alpha^j$, $j \leq P^q - 1$, where $\alpha^k 32 \alpha^j$.

Error detection and correction techniques for Reed-Solomon ECC's are well known. Id. One such technique begins with again encoding the code word data to generate ECC symbols and then comparing these ECC symbols with the ECC symbols in the code word, i.e. the ECC symbols generated by the pre-storage encoding of the data, to detect any errors in the retrieved data. [For a detailed discussion of this error detection technique, see U.S. Pat. No. 4,413,339 issued to Riggle and Weng].

The comparison of the two sets of ECC symbols is made by exclusive OR'ing ("XOR'ing") them. If there are no errors in the retrieved data, the XOR'ing will produce a string of symbols containing only zeros. If there are errors in the retrieved data, the result of the XOR'ing will be non-zero and error correction will be performed, if possible. If the number of non-zero symbols which result from the XOR'ing is less than the number of errors the code is designed to correct, all the errors are in the ECC symbols and no error correction is required. If the number of non-zero resulting symbols is equal to or greater than the number of errors the code is designed to correct, the data contains one or more errors and error correction is then performed.

In order to correct the data errors, the locations and the magnitudes or "values" of the errors must be determined. The first step in determining the error locations and the error values is to form error syndrome equations from the results of the XOR'ing of the ECC symbols. [For a detailed discussion of the generation of the error syndromes refer to U.S. Pat. No. 4,413,339 issued to Riggle and Weng]. The error syndromes are then used to generate polynomials which, when evaluated, will identify the location and the value of each of the errors.

Alternatively the error syndromes may be formed using the entire retrieved code word. This avoids the steps of re-encoding the retrieved data and comparing the ECC symbols with the retrieved ECC symbols. However, error syndromes will be generated for every code word, even those without errors, although in the latter case the syndromes will be identically zero. Where there are errors, i.e. the error syndromes are not zero, the syndromes are then used to locate and correct any errors in exactly the same manner as the syndromes formed from the results of the XOR'ing of the ECC symbols. The choice between these two arrangements may, for example, depend on whether the syndromes are generated in software or hardware.

The calculation of the values of the errors is necessarily dependent on their locations. Typically, the error locations are calculated first by using the error syndromes to generate an error locator polynomial $\delta(x)$. The solutions or roots of the equation, $\delta(x)=0$, designate the locations of the errors. The roots, $x_r$, are then substituted into an error evaluator polynomial $\Phi(x)$ and the polynomial is evaluated. The results are then divided by the corresponding values of the first derivative, $\delta'(x_r)$, of the error locator polynomial to provide the values of the errors. Once both the error locations and the corresponding error values are known, the data can then be corrected.

Reed-Solomon codes are cyclic codes, that is, if $v = c_1 c_2 c_3 \ldots c_{z-1} c_z$ is a code word, where $c_a$ is an element of the Galois Field used to encode the data and $z = P^q - 1$, then $v' = c_z c_1 c_2 c_3 \ldots c_{z-1}$ is also a code word. If a shortened code is used, it is likely that the code words will appear cyclic, that is, if $z = 00000 z_1 z_2 z_3 \ldots z_q 0$ is a code word, then $z' = 000000 z_1 z_2 z_3 \ldots z_q$ is a code word. However, $z'' = z_q 000000 z_1 z_2 z_3 \ldots z_{q-1}$ is not a code word in the shortened code because the first term of $z''$ is non-zero.

Thus if the boundaries of a code word are misinterpreted, for example, during a read operation, and the operation starts one or two complete symbols beyond the beginning of the code word and then appends one or two symbols from the beginning of the next code word to the end, the result is likely to be another code word. This means that if the head is not precisely synchronized, for example, to the start of the data section of a sector the code word read from the disk may contain only a portion of the data recorded in the sector and thus the data may be inaccurately interpreted by the data processing system. If, however, the synchronization is off by less than a complete symbol, the code will indicate the mis-synchronization by detecting a number of errors, typically more errors than the code is designed to correct. Thus it is desirable to encode the data such that a one or more full symbol mis-synchronization is indicated by the code.

SUMMARY OF THE INVENTION

The invention is an encoding system which encodes a predetermined number of symbols at the start of a code word such that later decoding of the code word reveals a mis-synchronization. In brief summary, a data encoder is set to initial condition by encoding preliminary symbols. The encoder is then used to encode the data to generate ECC symbols. The data and the generated ECC symbols are then recorded on a disk as code words. Thereafter, when the data code word is read it is again encoded in the initialized encoder to generate new ECC symbols. If the data read from the disk is one or more symbols out of synchronization, errors due to the initial condition will be found. The locations of the errors due to mis-synchronization will be in symbols corresponding to the initial condition, that is, in the preliminary symbols and beyond the boundary of the code word data, indicating the synchronization error. Alternatively, the locations of errors due to defects in the disk or misinterpretation of the data signal are within the code word data. Thus a mis-synchronization of one of more full symbols can be readily detected.

DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

Figure 1:
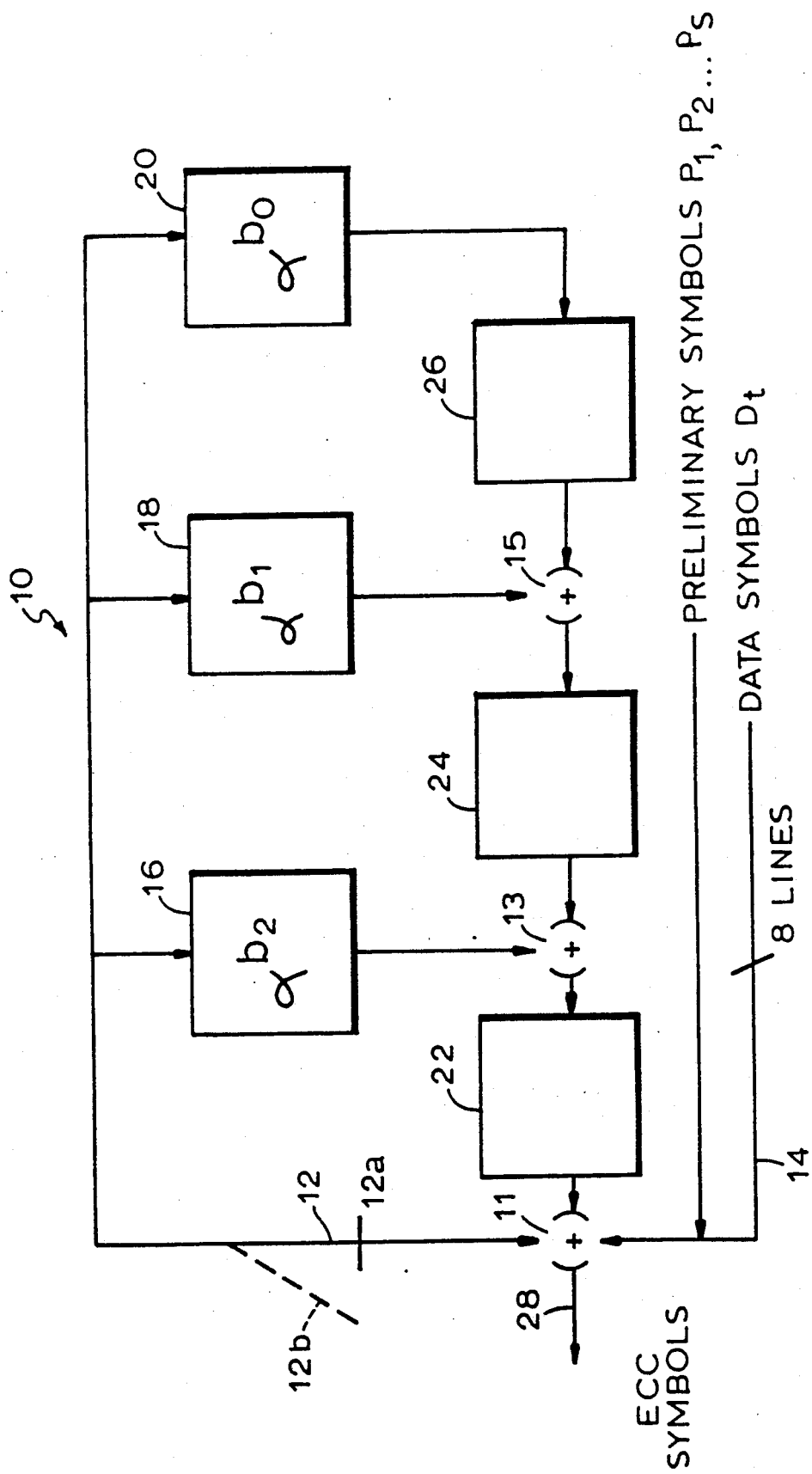
FIGS. 1 and 1A are functional block diagrams of an encoder.

With reference to FIG. 1, an encoder 10 includes multipliers 16-20 and adders 13-15, and 28 and registers 22-26. When data is encoded it is applied to the encoder 10 over line 14 and a switch 12 is in position 12a. The first data symbol, $D_1$, is applied to the encoder and added to the contents of register 22. The sum is then simultaneously multiplied by multipliers 16-20 which contain the coefficients of the ECC generator polynomial. The products are applied to adders 13-15 and added to the contents of registers 24 and 26, respectively. The sums are then stored in the appropriate registers 22-26. Each data symbol, $D_t$ applied to the encoder is similarly encoded.

Figure 3:
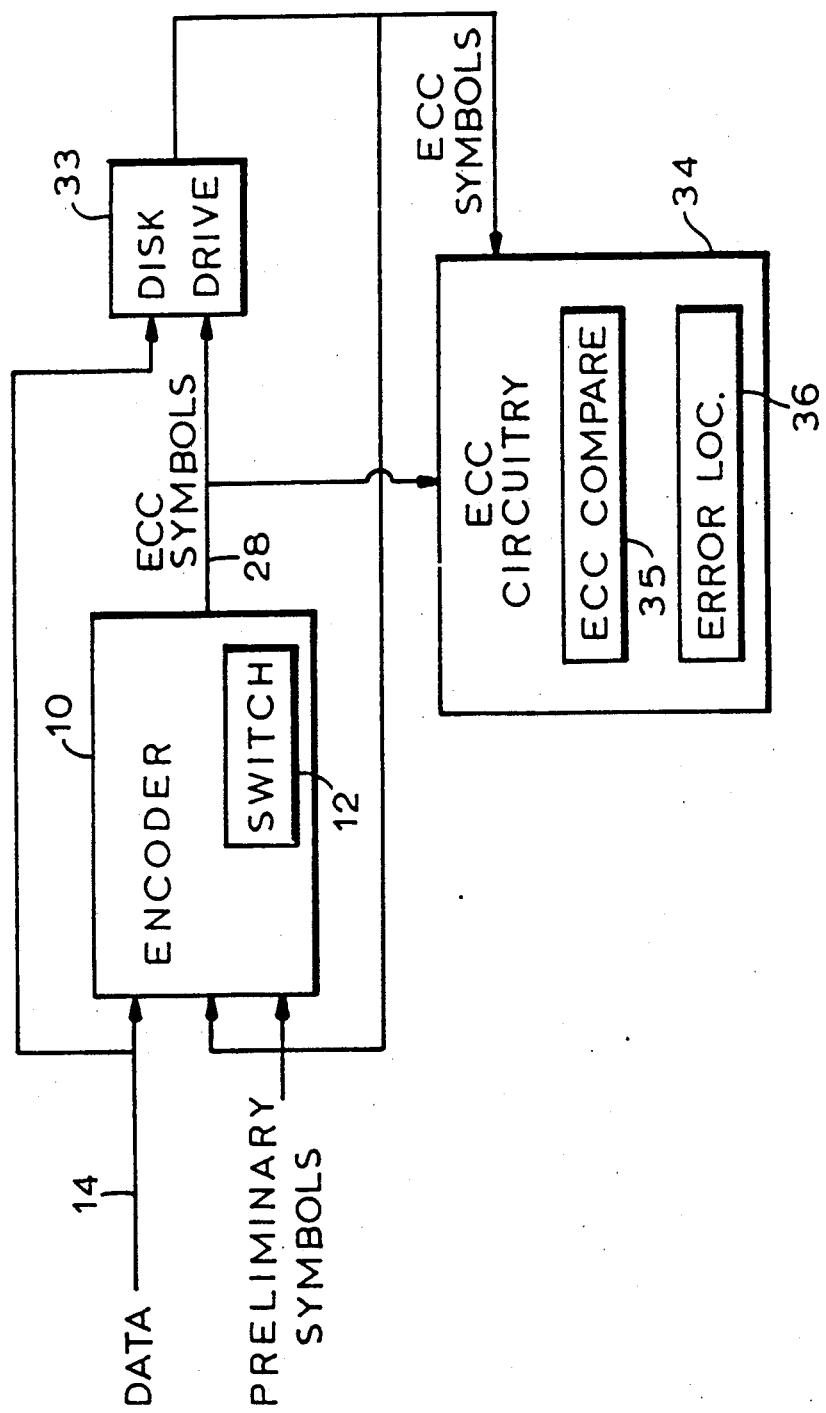
FIG. 3 is a block diagram of data storage and retrieval system which includes the encoder of FIGS. 1 and 1A.

After all the data symbols are encoded, the registers 22-26 contain the ECC symbols associated with the data. These symbols, which are read from the encoder 10 over line 28 when switch 12 is moved to position 12b, are then appended to the data to form the data code word. The code word is thereafter written to a disk in disk drive 33 (FIG. 3).

Figure 1A:
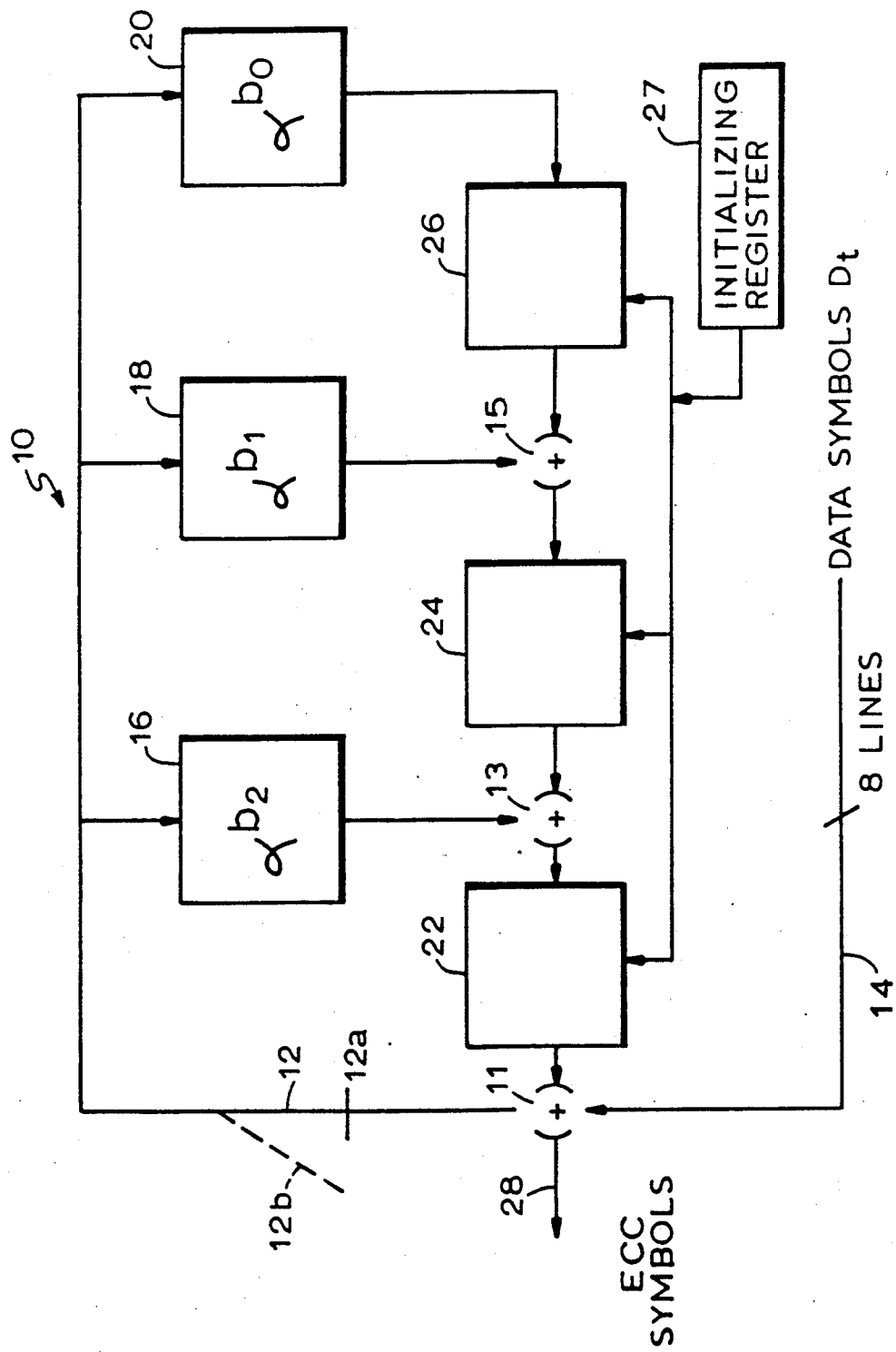

In accordance with the invention, a predetermined number of preliminary symbols, $P_1 - P_s$ are applied to the encoder 10 before the data symbols are applied. The preliminary symbols are encoded as described above and the results of the encoding are stored in registers 22-26. In the preferred embodiment one preliminary symbol consisting of all 1 is used to initialized the encoder. It will be appreciated by those skilled in the art that initializing the registers 22-26 to a predetermined condition using initializing register 27 (FIG. 1A), which contains symbols which are the same as the contents of registers 22-26 after the encoding of the preliminary symbols has the same effect as encoding one or more preliminary symbols.

Thereafter, the data symbols, $D_t$, are applied to the encoder and encoded to generate ECC symbols. The ECC symbols are read from the encoder 10 over line 28 and appended to the data to form a code word in disk drive 33 (FIG. 3).

Figure 2:
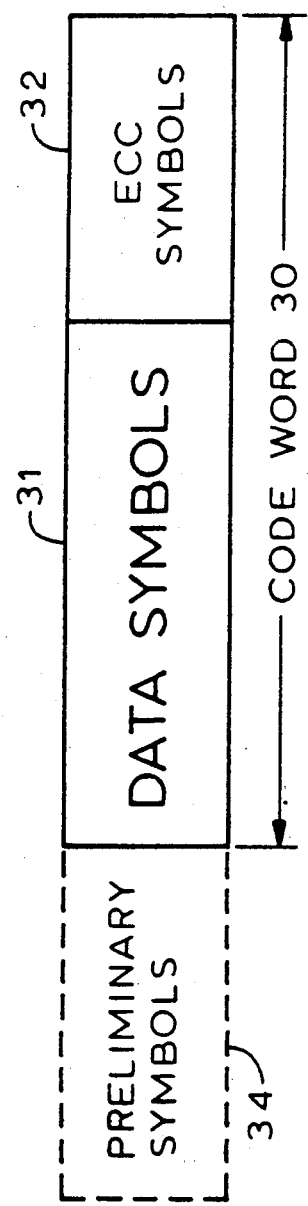
FIG. 2 is an illustration of a code word encoded in accordance with the preferred embodiment.

With reference to FIG. 2, a code word 30 includes a data symbol section 31 containing data symbols $D_t$ and an ECC symbol section 32 containing the ECC symbols generated by encoder 10. The preliminary symbols are not included in the code word data, and thus they do not increase the symbol length of the code word.

With reference to FIG. 3, when the code word is read from the disk in disk drive 33 the code data is encoded in encoder 10 (FIG. 1) to generate new ECC symbols for comparison with the code word ECC symbols. Before the data is applied to the encoder, the preliminary symbols are encoded as described above. The read data is then encoded. The new ECC symbols are read from the encoder 10 and compared with the code word ECC symbols in error correction circuitry 34. If there are no errors in the data and no synchronization errors, the result of the ECC symbol comparison will be all-ZERO symbols. If there are errors in the data and/or there is a mis-synchronization the comparison will result in non-ZERO symbols.

If the comparison results in non-zero symbols, the symbols are manipulated by the error location circuitry 36, using conventional techniques are used to determine the location of the errors. If any of the errors are due to mis-synchronization, the locations of at least one of the errors will be outside of the code word boundary, that is, the error will be located in the preliminary symbols, thus indicating the mis-synchronization.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method for detecting mis-synchronization for use with an encoder which encodes symbols in accordance with a generator polynomial $g(x)$ and produces redundancy symbols corresponding to the symbols, said method comprising the steps of:
   A. encoding a string of symbols comprising a predetermined number of selected preliminary symbols and a predetermined number of data symbols to produce redundancy symbols which correspond to the symbol string;
   B. concatenating the data symbols and the redundancy symbols to form a code word and recording the code word;
   C. retrieving said code word;
   D. encoding a string of symbols comprising the preliminary symbols and the retrieved code word data symbols to produce redundancy symbols which correspond to the symbol string; and
   E. comparing the redundancy symbols generated in step D with the redundancy symbols in the retrieved code word and if the symbols do not match, (i) finding the locations of errors associated with the code word, and (ii) signalling a mis-synchronization if any error locations are outside the code word.

2. A method for detecting mis-synchronization for use with an encoder which encodes symbols in accordance with a generator polynomial $g(x)$ and produces redundancy symbols corresponding to the symbols, said method comprising the steps of:
   A. initializing the encoder to a predetermined condition which corresponds to encoding a predetermined number of selected preliminary symbols;
   B. encoding data symbols using said initialized encoder, thereby producing redundancy symbols which correspond to both the preliminary symbols and the data symbols;
   C. concatenating the data symbols and said redundancy symbols to form a code word and recording said code word;
   D. retrieving said code word;
   E. initializing the encoder to said predetermined condition;
   F. encoding the retrieved code word data symbols using said initialized encoder to produce redundancy symbols; and
   G. comparing the redundancy symbols generated in Step F with the redundancy symbols in the retrieved code word and if the symbols do not match (i) finding the locations of errors associated with the code word, and (ii) signalling a mis-synchronization if any error locations are outside the code word.

3. An apparatus for detecting mis-synchronization between a disk containing stored data which is in the form of code words which contain data symbols and redundancy symbols which correspond to the encoding of a string of symbols comprising the data symbols and a set of predetermined preliminary symbols, and detecting circuitry that is used to detect and demodulate the stored data, for use with an encoder, said apparatus comprising:
   A. means for initializing the encoder to a predetermined condition corresponding to the encoding of the set of preliminary symbols and encoding data symbols in a retrieved code word to produce redundancy symbols;
   B. means for comparing the redundancy symbols generated by the initialized encoder with redundancy symbols in the retrieved code word and if the symbols do not match (i) finding the locations of errors associated with the code word, and (ii) signalling a mis-synchronization if any error locations are outside the code word.

4. An apparatus for detecting mis-synchronization between data stored on a magnetic storage medium in the form of code words which contain data symbols and redundancy symbols which correspond to the encoding of a string of symbols comprising the data symbols and a set of predetermined preliminary symbols and detection circuitry which retrieves and demodulates the stored code words, for use with a data encoder, the apparatus comprising:
   A. means for encoding to produce redundancy symbols a string of symbols comprising the set of a preliminary symbols and the data symbols in a code word retrieved from the magnetic storage medium; and
   B. means for comparing the redundancy symbols generated in said encoding means with retrieved redundancy symbols, and if the symbols do not match (i) finding the locations of errors associated with the retrieved code word, and (ii) signalling a mis-synchronization if any error locations are outside the code word.

5. A method for detecting mis-synchronization for use with a data retrieval system which retrieves data from a magnetic disk, the data being stored in the form of code words which contain data symbols and redundancy symbols which correspond to a string of symbols comprising data symbols and a predetermined set of selected preliminary symbols, said method comprising the steps of:
   A. retrieving a code word from a magnetic disk;
   B. initializing an encoder to a predetermined condition corresponding to the encoding of the set of preliminary symbols;
   C. encoding the retrieved data symbols using said initialized encoder to produce redundancy symbols;

D. comparing the redundancy symbols generated in step C with redundancy symbols in the retrieved code word and if the symbols do not match (i) finding the locations of the errors associated with the retrieved code word, and (ii) signalling a mis-synchronization if any error locations are outside the code word.

6. A method for detecting mis-synchronization between detection circuitry and data stored in the form of code words which contain data symbols and redundancy symbols which correspond to a string of symbols consisting of data symbols and a predetermined set of preliminary symbols, for use with a data encoder, said method comprising the steps of:

A. retrieving a stored code word;

B. encoding a string of symbols comprising the set of preliminary symbols and the data symbols in the retrieved code word to produce redundancy symbols which correspond to the symbol string; and C. comparing the redundancy symbols generated in step B with the redundancy symbols in the retrieved code word and if the symbols do not match (i) finding the locations of errors associated with the code word, and (ii) signalling a mis-synchronization if any error locations are outside the code word.

* * * * *